United States Patent
Lacour et al.

[11] 3,930,305
[45] Jan. 6, 1976

[54] METHOD FOR MANUFACTURING INTEGRATED CIRCUITS

[75] Inventors: Jacques Lacour, Grenoble; Michel Montier, Meylan; Jean-Pierre Suat, Echirolles, all of France

[73] Assignee: Commissariat a l'Energie Atomique, Paris, France

[22] Filed: June 8, 1973

[21] Appl. No.: 368,460

[30] Foreign Application Priority Data
June 15, 1972 France .................................. 72.21657

[52] U.S. Cl. .................................. 29/577; 29/590
[51] Int. Cl.² .................................. B01J 17/00
[58] Field of Search ............ 29/571, 591, 578, 580, 29/583, 589, 590, 624, 628, 630 R; 317/234 117/212, 217

[56] References Cited
UNITED STATES PATENTS

| | | | |
|---|---|---|---|
| 3,341,753 | 9/1967 | Cunningham et al | 317/234 |
| 3,495,324 | 2/1970 | Guthrie et al | 29/578 |
| 3,602,981 | 9/1971 | Kooi | 29/580 X |
| 3,641,661 | 2/1972 | Canning et al | 29/578 |
| 3,667,005 | 5/1972 | Cunningham et al | 317/234 |
| 3,700,508 | 10/1972 | Keen | 317/234 |

Primary Examiner—Roy Lake
Assistant Examiner—Craig R. Feinberg
Attorney, Agent, or Firm—Cameron, Kerkam, Sutton, Stowell & Stowell

[57] ABSTRACT

A method for manufacturing integrated circuits, said method comprising the steps of:
providing a first set of conductive zones on each of these portions of a substrate where electrical contacts are to be made, after having suitably doped said substrate with semiconductive material,
providing a selective insulating layer, so that the upper portions of said conductive zones be flush with the surface of said selective insulating layer, and
providing thereabove a second set of conductive zones adapted to constitute intended connections between said upper portions.

Said method can be applied to the manufacture of MOS transistors.

2 Claims, 4 Drawing Figures

METHOD FOR MANUFACTURING INTEGRATED CIRCUITS

The present invention relates to a method for manufacturing integrated circuits.

As a rule, the results obtained to this day in the field of integrated circuits (MOS or 2 - pole transistors) indicate that, in all instances, the area occupied by such a circuit is a factor of paramount importance, which governs the efficiency of its manufacture.

Apart from all successive improvements aiming at increasing the efficiency of each manufacturing step, it must be emphasized that any novel principle intended to decrease the area of an integrated circuit will have a major bearing as regards the improvement of the efficiency of its manufacture.

It is to be noted, in this respect, that, depending on how electrical connections are made, the area of a given integrated circuit can be considerably lessened.

Other features of the present invention will appear from the following description, with reference to the accompanying drawing, in which FIGS. 1a to 1d are diagrammatic cross-sections showing the various steps in the manufacture of connections according to a known method;

Figure 1:
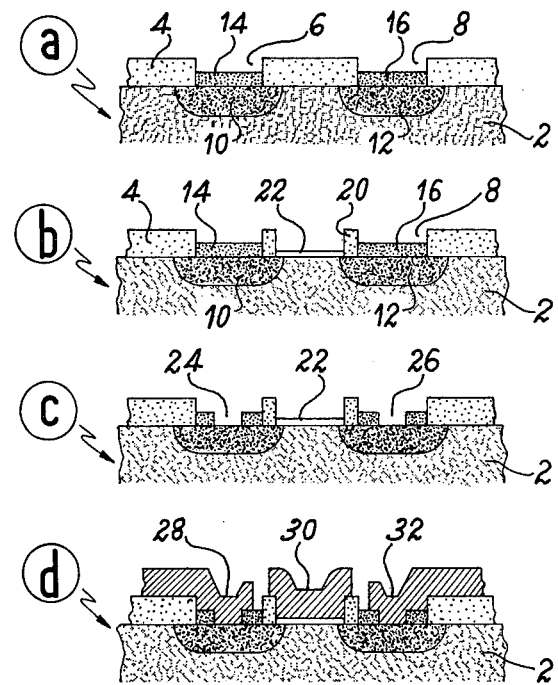

A method of the prior art for manufacturing a MOS transistor (FIGS. 1a to 1d) comprises eight main stages:

Starting from a silicon chip 2 of known type on which has been grown a thick layer 4 of insulating material, two diffusing windows 6 and 8 are opened in said layer, for obtaining the transistor source and drain, respectively.

Through diffusion are created the drain and source zones, 10 and 12 respectively, such diffusion being accompanied by the growth of insulators 14, 16 covering windows 6 and 8, respectively.

Then (FIG. 1b) a window 20 is opened between the two diffusion zones for creating gate insulator 22. Next, insulating layers 14 and 16 are engraved (FIG. 1c) for making electrical connections (windows 24 and 26). The area of these windows is smaller than that of diffusion windows 6 and 8.

Then (FIG. 1d) an engraved metal layer is deposited on windows 22, 24 and 26 for providing contacts 28, 30 and 32 and their interconnections simultaneously.

It is to be noted that some stages of the method are rather ticklish. This is especially true as regards engraving the insulator which requires a very accurate positioning of the contact holes with respect to the diffusion zones, and also as regards the application of the metal layer.

The present invention is specifically concerned with a method for manufacturing integrated circuits which is devoid of the above drawbacks.

The present method essentially comprises the steps of providing a first set of conductive zones on each of the integrated circuit zones where electrical contacts are desired, of providing a selective insulating layer so that the upper portions of said conductive zones be flush with the surface of said selective insulating layer, and of providing thereabove a second set of conductive zones adapted to constitute the intended connections.

According to a first embodiment, said selective insulating layer is obtained by first depositing an insulating layer of substantially even thickness, and then etching the insulator in such a manner that the protrusions corresponding to the first set of conductive zones are etched far more quickly than the holes of the insulating layer.

According to a second embodiment, said selective insulating layer is obtained by depositing, on the upper face of the first set of conductive zones, a material capable of preventing the insulator from adhering to the metal deposited.

The present invention also relates to the application of the above method to the manufacture of MOS transistors, comprising the steps of:

growing an insulating layer (adapted to form the gate of said MOS transistor) on a chip of a semi-conductive material doped with impurities of a given type;

opening two windows in said layer, and carrying out a doping with impurities of the reverse type through said windows, for creating the source and drain of said transistor without growing the insulator;

depositing a first conductive layer and engraving said layer;

depositing a selective insulating layer;

depositing a second conductive layer, and defining said layer so as to provide the necessary interconnections.

It is to be noted that, according to the present method, after the diffusion or the implantation of impurities required for forming the transistor drain and source, no engraving whatever has to be carried out in an insulating layer for positioning a conductive contact. This is an important advantage of the invention, since the positioning of an engraving in an insulator is very uneasily achieved and the doped zone has to be made wider in view of an inaccurate positioning.

In addition, on account of the insulating layer and since the conductive zones of the first set are flush with the upper surface of said layer, the metal deposits forming the interconnections do not contain any high steps, which decreases the number of the circuits rendered defective by such interconnections.

In FIGS. 2a to 2d are shown the various stages of the manufacture of a MOS transistor according to the present invention:

Starting from of a silicon chip 34 doped with, e.g., impurities of the P-type, a first layer 36, acting both as a gate insulator and as a screen against diffusion, is grown or deposited.

On said layer 36 can be deposited a silicon nitride layer 38 with a view to improving its function. Through layers 36 and 38 are opened two windows 40 and 42 serving to diffuse the source and drain doping impurities.

Figure 2:
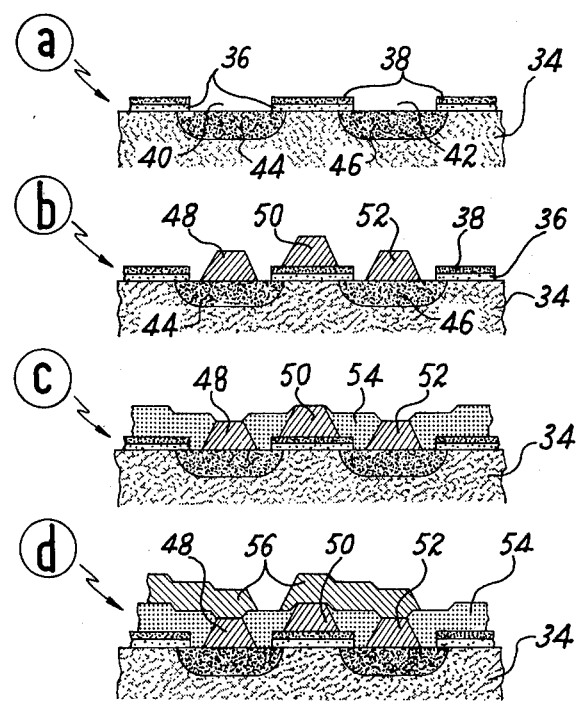
FIGS. 2a to 2d are diagrammatic cross-sections similar to FIGS. 1a to 1d but corresponding to the present invention.

Through said windows 40 and 42 are diffused or implanted impurities of the N-type for creating the source and drain zones 44 and 46 respectively, however with no surface oxidization. On that face of chip 34 is deposited a metal layer of substantially even thickness, preferably of aluminum. Then, by engraving is defined the first level of connections 48, 50, 52 corresponding to the source, to the drain and to the gate, respectively (FIG. 2b).

In the following operating step (FIG. 2c), a thick selective layer 54, preferably of silica, is deposited, in such a manner that the upper faces of metal contacts 48, 50 and 52 be flush with the upper face of said insulating layer 54.

Two main types of methods may be resorted to for depositing the selective insulating layer.

According to the first type, the silica deposited is etched at different speeds according as it corresponds to the protruding zones (metal contacts) or to the holes.

According to the second type, the deposition of an insulating layer on the metal contacts is avoided.

With the methods of the first type, it is possible to obtain various etching speeds.

According to a first method of said first type, the substrate covered with silica is submitted to vibrations in an etching bath.

Figure 3:
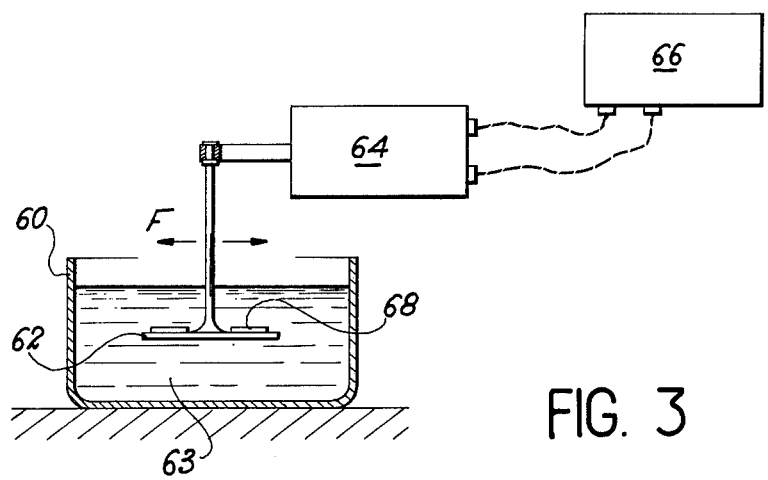
FIG. 3 shows a device for carrying out a selective insulating deposit.

FIG. 3 shows a device for carrying out that method.

Said device comprises a tank 60 filled with a solution 63 for etching silica, and a vibrating plate 62 connected to a vibrator 64 of known type, adapted to move said plate in the directions shown by arrow F, according to a sinusoidal law. Vibrator 64 is fed by a signal generator 66.

On plate 62 are placed substrates such as 68, on which silica has already been deposited. Thus is achieved an even etching of the silica slice which covers the zones where metal layers were deposited and which protrude from the remainder of the silica layer.

The frequencies used can be of from 10 Hz to 10 kHz, and the amplitudes of about 3 mm.

According to a second method, a mechano-chemical levelling of the oxide deposited on the protrusions is carried out.

According to a third method, the velocity of the etching of silica deposited on metal portions is changed by covering said portions exclusively, with a layer of phosphorus-doped silica.

Prior to etching, phosphorus is caused to diffuse in the upper layer.

Such a procedure is not suitable for aluminum, but is satisfactory with polycrystalline silica or with a heat-resistant refractory metal.

A fourth method can be carried out when the conductive zones are of molybdenum.

FIGS. 4a to 4c show the various stages of such a method.

Figure 4:
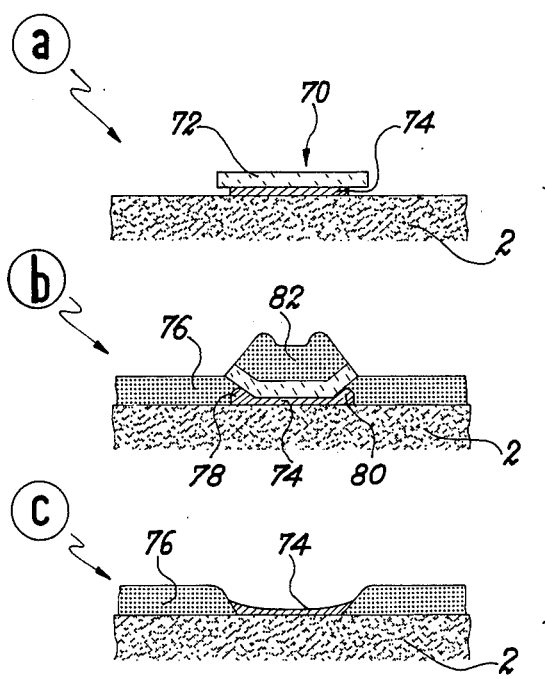
FIGS. 4a to 4c are diagrammatic cross-sections showing the various steps of a modification of the method according to the invention for carrying out a selective insulating deposit.

First phosphorus-doped silica is deposited in the vapour state on the layer of molybdenum (FIG. 4). We have e.g.

$$0.05 < \frac{PH_3 \text{ flow rate}}{SiH_4 \text{ flow rate}} < 0.2$$

The two layers are engraved, thus providing stud 70, comprising a molybdenum layer 74 and a doped silica layer 72 (FIG. 4a).

Molybdenum layer 74 is slightly over-engraved in order that silica layer 72 be overhanging. These two layers are each about 2,000 A thick. Then (as shown in FIG. 4b) a silica layer 76 is deposited on the whole chip, at a temperature of about 750°F (400°C) in an oxidizing gaseous medium ($O_2$ and $H_2O$).

Through oxidization of its upper surface and of its edges, molybdenum is caused to swell (as shown at 78 and 80).

The structure shown in FIG. 4b results from the deformation undergone by doped silica layer 72 caused by the mechanical stresses due to the difference between the coefficients of expansion of the molybdenum, the doped silica and the silica and the swelling of the molybdenum layer. A break is produced in portion 82 of silica layer 76, which exposes the edge of doped silica layer 72.

By using a selective solvent for phosphorus-doped silica, it is possible to etch layer 72 very quickly and, simultaneously, to withdraw non-doped silica layer 82. Thus is obtained the structure shown in FIG. 4c, where the surface of molybdenum contact 74 is free from silica.

According to the methods of the second type, it is possible to eliminate the insulating layer
 either by thermally cracking a material interposed between the silica deposit and the metal connections, said material being preferably the resin used for engraving the metal contacts,
 or by decomposing a material formed during the deposition of silica and which prevents the latter from being deposited on the metal connections.

The latter method, which is especially suitable for molybdenum connections, consists in inducing a partial sublimation of molybdenum while silica is being deposited in a gaseous state, so that the gases thus formed prevent silica from being deposited on molybdenum.

To this end, a small amount of hydrochloric gas (preferably 0.4 %) is added, in the carrier gas, to the silane and to the oxygen required for the production of silica. Thus is obtained the sublimation of a small fraction of molybdenum, which gives a volatile compound; so called "chlorhydrine" preventing silica from being deposited on molybdenum.

In the last stage, illustrated by FIG. 2d, a second metal deposit 56 is formed and engraved for providing the required interconnection. The engraving of the metal deposits can be achieved by any known means, e.g. by applying a photoengraving method with a mask.

Instead of engraving the metal deposit, it is possible to define the operative conductive zone in a different manner, in a uniform layer (for forming either the contacts or the interconnections); for instance, one might oxidize the mass of the metal deposit, according to a known method, outside the operative conductive zone ("Electronics", July 20, 1970, page 33).

It consists in forming a uniform deposit of aluminum over the whole surface of the silicon substrate. By means of a suitable resin, one masks the zones where the electrical contacts are to be made.

The silicon chip is then submitted to an oxidizing agent. Thus is achieved the transformation into alumina of the aluminum of the zones that have not been masked. In a second step, resin is eliminated by means of a solvent. Such a method offers the advantage of both permitting to define the conductive zones and providing the selective insulating layer.

It is thus possible to obtain conductive zones of any desired shape; for instance, the substrate is sensitized at given places by applying a treatment that permits metal deposits to be fixed only on desired portions of the substrate; such a treatment is disclosed in an article by P.T. STROUD, "Thin split films" 9/72, pages 273 to 281.

It will be easily understood that with the method according to the present invention, the margin of error, or allowance, regarding the positioning of the second level of interconnections (viz, of metal layer 56) is no longer to be considered.

This method is thus space-saving and, therefore, allows to achieve a more elaborate miniaturization of the electronic component to be manufactured.

Moreover, the method according to the invention requires but three engraving steps, and accordingly, three masks only.

In addition, the present method can be applied in other technical fields, e.g. in techniques dealing with gate self-alignment, requiring ionic implantation, or dealing with the manufacture of molybdenum or polycrystalline silicon contacts.

Although the present invention has been described as applied to the manufacture of M.O.S. transistors, it is to be understood, however, it might be applied as well to the manufacture of other semi-conductive components.

We claim:

1. A method for manufacturing integrated circuits, said method comprising the steps of:

providing a first set of electrically conductive areas on each of those portions of an integrated circuit substrate having doped zones on which electrical contacts are to be made, providing a selective insulating layer by gaseous deposition, so that the upper portions of said conductive areas be flush with the surface of said selective insulating layer, and providing thereabove a second set of conductive areas adapted to constitute connections between said upper portions, wherein said selective insulating layer is obtained by depositing, on the upper faces of the conductive areas of said first set, a material capable of preventing said insulating layer from adhering to the conductive portions, wherein said conductive areas are made of molybdenum and said selective insulating layer is obtained by submitting said substrate to a gaseous stream containing silane ($SiH_4$) oxygen and hydrochloric gas with sublimation of a small part of the molybdenum preventing formation of silica on the molybdenum areas.

2. A method for manufacturing integrated circuits, said method comprising the steps of:

providing a first set of electrically conductive areas on each of those portions of an integrated circuit substrate having doped zones on which electrical contacts are to be made, providing a selective insulating layer by gaseous deposition, so that the upper portions of said conductive areas be flush with the surface of said selective insulating layer, and providing thereabove a second set of conductive areas adapted to constitute connections between said upper portions, wherein said selective insulating layer is obtained by first depositing an insulating layer of substantially even thickness, and then etching said insulating layer forming protrusions and holes in such a manner that said protrusions corresponding to the first set of conductive areas are etched far more quickly than said holes of said insulating layer, wherein said conductive areas are made of molybdenum and comprising the steps of:

depositing doped silica on said conductive areas, depositing an even layer of silica, in a gaseous state and in an oxidizing medium, on said substrate, whereby molybdenum is caused to swell and a break is formed in the silica layer portion covering said molybdenum, and removing said portion by means of a solvent.

* * * * *